United States Patent
Chang et al.

(10) Patent No.: US 7,919,789 B2
(45) Date of Patent: Apr. 5, 2011

(54) LATERAL LIGHT-EMITTING DIODE BACKLIGHT MODULE

(75) Inventors: Chia-Hsien Chang, Yongjing Township, Changhua County (TW); Yi-Tsuo Wu, Jhonghe (TW); Hsiao-Chiao Li, Sinjhuant (TW)

(73) Assignee: Everlight Electronics Co., Ltd., Tu Chen, Taipei Hsien (TW)

( * ) Notice: Subject to any disclaimer, the term of this patent is extended or adjusted under 35 U.S.C. 154(b) by 243 days.

(21) Appl. No.: 12/344,108

(22) Filed: Dec. 24, 2008

(65) Prior Publication Data

US 2009/0168403 A1 Jul. 2, 2009

(30) Foreign Application Priority Data

Dec. 27, 2007 (TW) ................................ 96150590 A

(51) Int. Cl.
*H01L 33/00* (2010.01)
(52) U.S. Cl. .................. 257/99; 257/E33.001; 257/918
(58) Field of Classification Search .................... 257/79, 257/82, 88, 99, 918, E33.001, 675, 678, 706, 257/718, 720, 796, E29.119, E23.101, E23.103, 257/E23.105
See application file for complete search history.

(56) References Cited

U.S. PATENT DOCUMENTS

2007/0165417 A1 7/2007 Wu et al.
2008/0315214 A1* 12/2008 Wall et al. ........................ 257/81

FOREIGN PATENT DOCUMENTS

| CN | 1442910 | 9/2003 |
| JP | 2005513815 | 5/2005 |
| JP | 2006114854 | 4/2006 |
| JP | 2007095555 | 4/2007 |

* cited by examiner

*Primary Examiner* — Davienne Monbleau
*Assistant Examiner* — Monica D Harrison
(74) *Attorney, Agent, or Firm* — Muncy, Geissler, Olds & Lowe, PLLC

(57) ABSTRACT

A lateral light-emitting diode backlight module includes a base, a circuit board, and at least a light emitting diode wherein the base having a heat conductor, the circuit board having a conductive pad formed on a surface thereof, and the circuit board disposed on the heat conductor and connected to the heat conductor. Each light emitting diode comprising a substrate, a heat sink fastened to the substrate and connected to the heat conductor, an LED chip disposed on the heat sink and emits light laterally, and a pin mounted on the substrate and extended to the conductive pad of the circuit board.

17 Claims, 2 Drawing Sheets

LATERAL LIGHT-EMITTING DIODE BACKLIGHT MODULE

RELATED APPLICATIONS

This application claims priority to Taiwan Application Serial Number 96150590, filed Dec. 27, 2007, which is herein incorporated by reference.

BACKGROUND

1. Field of Invention

The present invention relates to a light-emitting diode backlight module. More particularly, the present invention relates to a light-emitting diode backlight module with disconnected paths of heat dissipation and electric power conduction.

2. Description of Related Art

White light-emitting diode (white LED) lamps have gradually superseded cold cathode fluorescent lamps (CCFL) lamps form different size backlight modules. Applying the lateral light-emitting diodes as a light source can reduce the depth of the backlight module to satisfy the needs of thin products.

Heat dissipation is always a major choking point in LED backlight module development. In accordance with medium and large sized LED backlight modules, the heat accumulation of the LED chip brings wavelength change and luminosity loss. For the forgoing reasons, there is a need to improve the heat dissipation capability to maintain the luminosity of LED and extend the life of the LED backlight module.

The conventional lateral light-emitting diode employs leadframes to dissipate heat, whereby both the heat dissipation and electric power conduction are performed at same time. However, the heat dissipation function of the leadframe is not sufficient to handle higher and higher power requirement of the high power LEDs.

SUMMARY

The present invention is directed to a lateral light-emitting diode backlight module (lateral LED backlight module) to improve heat dissipation capability of the LED backlight module.

In accordance with the embodiments of the present invention, a lateral LED backlight module is disclosed. The lateral LED backlight module includes a base, a circuit board, and at least a light emitting diode; wherein the base having a heat conductor, the circuit board having a conductive pad formed on a surface thereof, and the circuit board disposed on the heat conductor and connected to a light emitting diode. Each light emitting diode comprising a substrate, a heat sink fastened to the substrate and connected to the heat conductor, an LED chip disposed on the heat sink and emits light laterally, and a plurality of pins mounted on the substrate and extended to the conductive pads of the circuit board.

In conclusion, the lateral LED backlight module of the embodiment of the present invention ensures the heat conductor touches the heat sink of the light emitting diode to dissipate heat from the heat sink to the heat conductor, whereby both the heat dissipation area and volume can be enlarged to improve the heat dissipation capability of the lateral LED backlight module.

Moreover, the embodiment of the present invention provides a lateral LED backlight module with disconnected paths of heat dissipation and electric power conduction, whereby the balancing point of the heat and electric power can be controlled to maintain the performance of the lateral LED backlight module.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
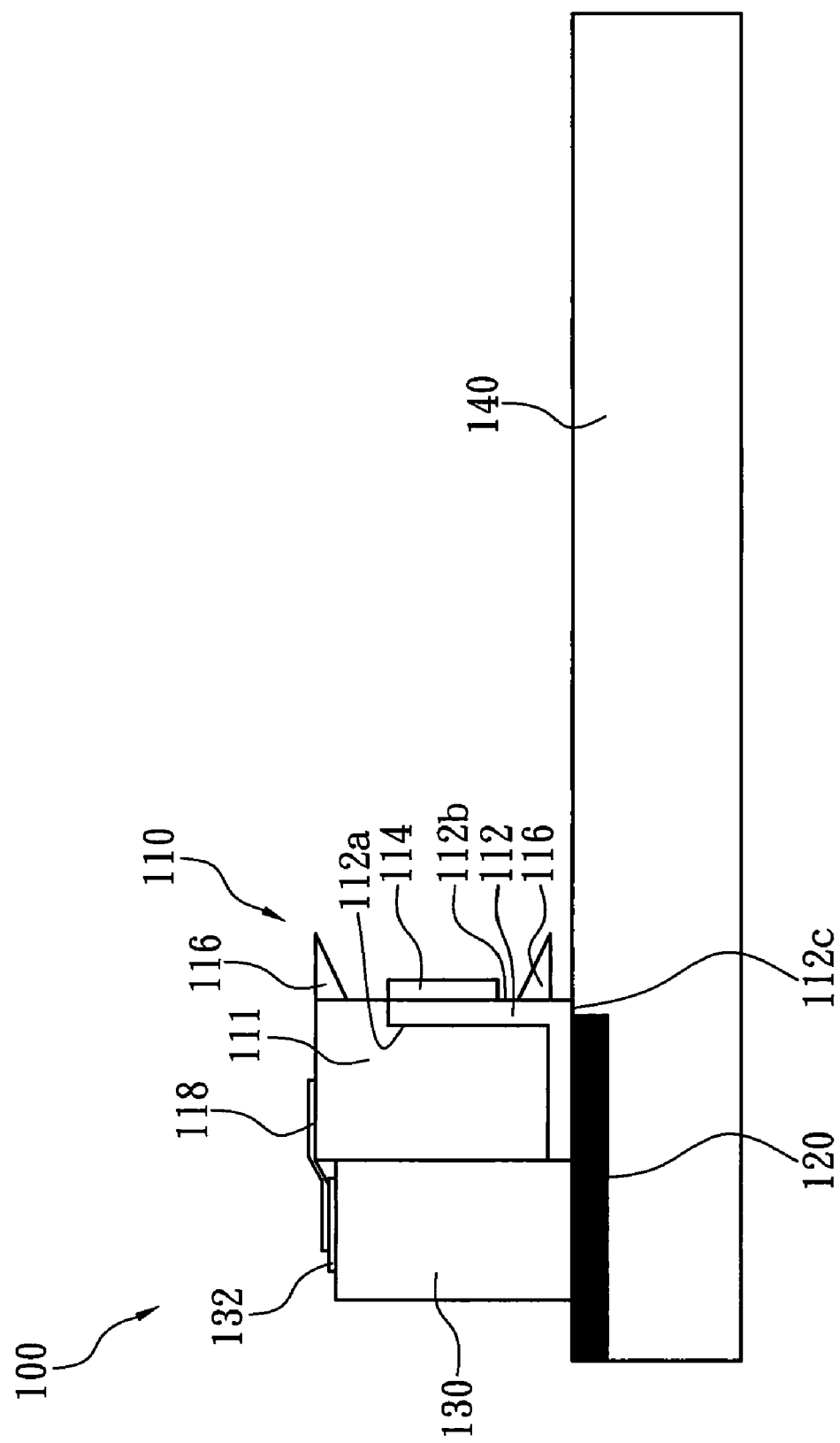
FIG. 1 is a schematic sectional view of the lateral LED backlight module in accordance with an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Refer to the FIG. 1. FIG. 1 is a schematic sectional view of the lateral LED backlight module in accordance with an embodiment of the present invention. Lateral LED backlight module 100 includes a light emitting diode 110, a heat conductor 120, a circuit board 130, and a base 140.

The light emitting diode 110 includes a substrate 111, a heat sink 112, an LED chip 114, and a plurality of pins 118. The heat sink 112 is fastened to the substrate 111 and connected to the heat conductor 120. The LED chip 114 is disposed on the heat sink 112 and emits light laterally. The pins 118 are mounted on the substrate 111 and extended to the circuit board 130.

The heat sink 112 has an inner surface 112a, a chip-mounting surface 112b, and an outer surface 112c. In accordance with the embodiment of the present invention, the inner surface 112a is connected with a surface of the substrate 111, wherein the substrate comprises metal, non-metal, and polymer. The chip-mounting surface 112b, on the opposing side of the inner surface 112a, provides a chip mounting area to mount an LED chip. The outer surface 112c is connected with a surface of the heat conductor 120 to dissipate the heat derived from the LED chip 114 through the heat sink 112 to the heat conductor 120 of the base 140. The heat sink 112 comprises heat conducting material, such as silver, copper, copper alloys, silver-copper alloys, aluminum, aluminum alloys, ceramic material, and polymers. In an embodiment of the present invention, the heat sink 112 further comprises a reflective coating layer, such as gold or silver coating layer.

In accordance with the embodiment of the present invention, further comprises a reflector 116 disposed on the chip-mounting surface 112b of the heat sink 112 to providing an inner space to define the chip-mounting area and reflecting the light emitted from the LED chip 114. The reflector 116 comprises metal, non-metal or polymer. In an embodiment of the present invention, the reflector 116 further comprises a reflective layer formed on an inner wall of the reflector 116, such as a gold coating layer or a silver coating layer.

The circuit board 130 is disposed on the heat conductor 120 of the base 140.and connected to the substrate 111 of the light emitting diode 110. In an embodiment of the present invention, the heat conductor 120 comprises silver, copper, aluminum and the alloy thereof, the circuit board 130 comprises an insulating material.

Figure 2:
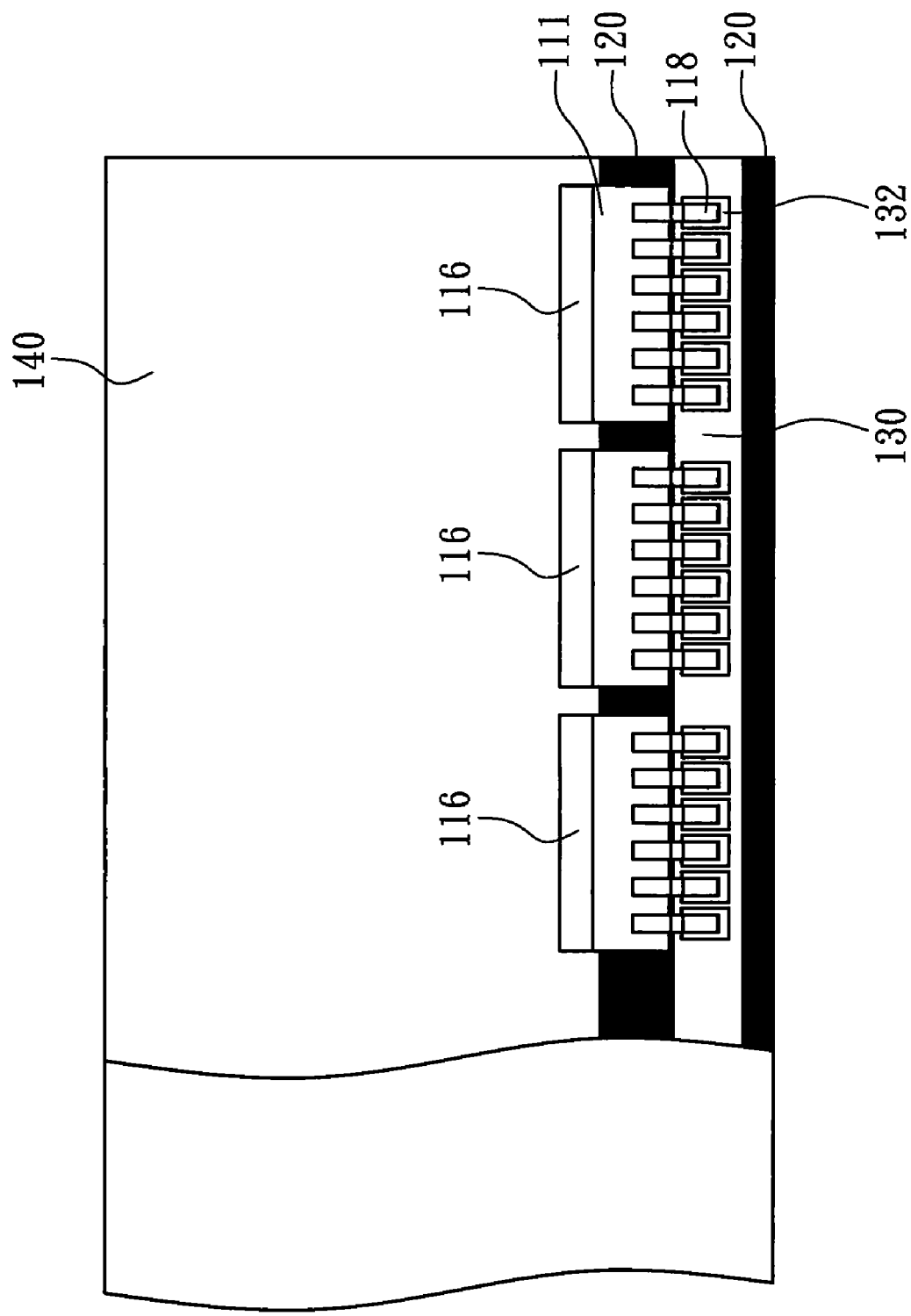
FIG. 2 is a schematic vertical view of the lateral LED in FIG. 1.

A conductive pad 132 is formed on a surface of the circuit board 130 and connected with the pin 118. In an embodiment of the present invention, the pin 118 comprises silver, copper, aluminum, and the alloy thereof. The pin 118 is mounted on the substrate 111 and extended to stick out the substrate 111 to connect with the conductive pad 132. Refer to the FIG. 2. FIG. 2 is a schematic vertical view of the lateral LED backlight module in FIG. 1.

The heat conductor 120 is mounted on the base 140, and the circuit board 130 is mounted on the heat conductor 120. A plurality of conductive pads 132 are set on the circuit board 130 to input the electric power. In accordance with an embodiment of the present invention, the base 140 is formed by a heat conductive metal material, such as silver, copper, aluminum, the alloy thereof, and ceramic material (such as aluminum oxide or aluminum nitride).

A plurality of the light emitting diodes 110 are mounted on the heat conductor 120 and a portion of the base 140 to form a backlight module, wherein the outer surface 112c of the heat sink 112 of each light emitting diode 110 is mounted to a surface of the heat conductor 120.

The engaged substrate 111 and the heat sink substrate 112 can contribute the heat conduction from the light emitting diode 110 to the heat conductor 120, that is, the heat produced from the LED chips 114 are transferred to the heat conductor 120 by the substrate 111 and the heat sink 112, whereby both the heat dissipation area and volume can be enlarged to improve the heat dissipation capability of the lateral LED backlight module 100.

The reflector 116 reflects the light beam emitted form the LED chips 114 to enhance the lighting efficiency, whereby the luminosity of the backlight module can be improved.

Each pin 118 mounted on the substrate 111 of the light emitting diode 110 is extended to stick out the substrate 111 and connected to the respective conductive pad 132 of the circuit board 130 to input electric power.

In summary, the pins of the lateral LED backlight module in accordance with embodiments of the present invention only serve as a conductive electrode, and the heat sink and the heat conductor dissipate the heat derived from the LED chip working, whereby the paths of heat dissipation and electric power conduction are disconnected. Therefore, the balancing point of the heat dissipation and electric power conduct can be controlled to maintain the performance of the lateral LED backlight module.

Although the present invention has been described in considerable detail with reference t certain preferred embodiments thereof, other embodiments are possible. Therefore, the spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lateral LED backlight module, comprising:
   a base, having a heat conductor;
   a circuit board, having a conductive pad formed on a surface of the circuit board, the circuit board disposed on the heat conductor and connected to the base; and
   at least a light emitting diode, comprising:
      a substrate;
      a heat sink, fastened to the substrate and connected to the heat conductor;
      an LED chip, disposed on the heat sink and emits light laterally; and
      a pin, mounted on the substrate and extended to the conductive pad of the circuit board.

2. The lateral LED backlight module of the claim 1, wherein the heat sink comprises an inner surface, a chip-mounting surface, and an outer surface, the inner surface connected to the substrate, the outer surface connected to the heat conductor, and the LED chip mounted to the chip-mounting surface.

3. The lateral LED backlight module of the claim 1, further comprises a reflector disposed on the chip-mounting surface of the heat sink for reflecting the light emitted from the LED chip.

4. The lateral LED backlight module of the claim 3, further comprises a reflective layer formed on an inner wall of the reflector.

5. The lateral LED backlight module of the claim 3, wherein the reflective layer comprises a gold coating layer or a silver coating layer.

6. The lateral LED backlight module of the claim 3, wherein the reflector comprises metal, non-metal or polymer.

7. The lateral LED backlight module of the claim 1, wherein the base comprises a heat conductive material.

8. The lateral LED backlight module of the claim 7, wherein the heat conductive material comprises ceramic material, silver, copper, aluminum and the alloy thereof.

9. The lateral LED backlight module of the claim 8, wherein the ceramic material comprises aluminum oxide or aluminum nitride.

10. The lateral LED backlight module of the claim 1, wherein the heat conductor comprises silver, copper, aluminum and the alloy thereof.

11. The lateral LED backlight module of the claim 1, wherein the circuit board comprises an insulating material.

12. The lateral LED backlight module of the claim 1, wherein the substrate comprises metal, non-metal, and polymer.

13. The lateral LED backlight module of the claim 1, wherein the heat sink comprises silver, copper and the alloy thereof, ceramic material or polymer.

14. The lateral LED backlight module of the claim 1, further comprises a reflective coating layer formed on the heat sink.

15. The lateral LED backlight module of the claim 14, wherein the reflective coating layer comprises gold or silver coating layer.

16. The lateral LED backlight module of the claim 1, wherein the pin comprises silver, copper, aluminum and the alloy thereof.

17. The lateral LED backlight module of the claim 1, wherein the heat produced from the LED chip is transferred to the heat conductor by the substrate and the heat sink.

* * * * *